(12) United States Patent
Onishi

(10) Patent No.: US 7,884,657 B2
(45) Date of Patent: Feb. 8, 2011

(54) OSCILLATION FREQUENCY CONTROL CIRCUIT

(75) Inventor: Naoki Onishi, Chitose (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 0 days.

(21) Appl. No.: 12/801,772

(22) Filed: Jun. 24, 2010

(65) Prior Publication Data
US 2010/0264961 A1 Oct. 21, 2010

Related U.S. Application Data

(63) Continuation of application No. PCT/JP2008/003108, filed on Oct. 30, 2008.

(30) Foreign Application Priority Data
Dec. 25, 2007 (JP) .................. P. 2007-331767

(51) Int. Cl.
*H03L 7/06* (2006.01)
(52) U.S. Cl. ...................... 327/156; 327/147
(58) Field of Classification Search ............... 327/147, 327/156
See application file for complete search history.

(56) References Cited

U.S. PATENT DOCUMENTS

| 6,337,589 | B1 * | 1/2002 | Ooishi ........................ 327/156 |
| 6,498,536 | B1 * | 12/2002 | Mori ........................... 331/11 |
| 6,525,578 | B2 * | 2/2003 | Ooishi ........................ 327/156 |
| 6,842,399 | B2 * | 1/2005 | Harrison ................. 365/189.07 |
| 7,733,151 | B1 * | 6/2010 | Yu et al. ....................... 327/291 |
| 7,800,451 | B2 * | 9/2010 | Fu et al. ......................... 331/4 |
| 7,800,455 | B2 * | 9/2010 | Koyama et al. ............... 331/57 |
| 7,804,344 | B2 * | 9/2010 | Ma et al. ..................... 327/158 |
| 7,805,122 | B2 * | 9/2010 | Lerner et al. ................. 455/255 |
| 2002/0030520 | A1 * | 3/2002 | Ooishi ......................... 327/156 |
| 2002/0181640 | A1 * | 12/2002 | Asakawa et al. ............ 375/376 |
| 2007/0182467 | A1 * | 8/2007 | Nakamuta ................... 327/156 |
| 2009/0261874 | A1 * | 10/2009 | Lin ............................. 327/156 |

(Continued)

FOREIGN PATENT DOCUMENTS

JP 60-186115 9/1985

(Continued)

OTHER PUBLICATIONS

Office Action issued on Jul. 28, 2010 from Japan Patent Office in corresponding Japanese patent application No. 2007-331767 (English translation attached).

*Primary Examiner*—Lincoln Donovan
*Assistant Examiner*—Adam D Houston
(74) *Attorney, Agent, or Firm*—Jacobson Holman PLLC

(57) ABSTRACT

Provided is an oscillation frequency control circuit for correcting its frequency, keeping the oscillation frequency stable when self-oscillating, and oscillating with a control voltage generated by making a fixed voltage given from outside variable. In the oscillation frequency control circuit, a CPU selects/outputs the control voltage preferentially according to a command of a control voltage selection. If the command is not given and the level of an outside reference signal detected by a detecting circuit is within an adequate range, it turns a select switch on. If the command is not given and the level of the outside reference signal is out of the adequate range, it turns the select switch off and outputs information about pulse generation stored in a memory to a PWM circuit.

16 Claims, 8 Drawing Sheets

U.S. PATENT DOCUMENTS

2010/0214031 A1 *   8/2010   Yamamoto et al. ............ 331/34

FOREIGN PATENT DOCUMENTS

| JP | 01-307317 | 12/1989 |
| JP | 02-305024 | 12/1990 |
| JP | 04-007911 | 1/1992 |
| JP | 04-070010 | 3/1992 |
| JP | 04-50935 | 4/1992 |
| JP | 04-343524 | 11/1992 |
| JP | 04-369927 | 12/1992 |
| JP | 05-243992 | 9/1993 |
| JP | 2000-083003 | 3/2000 |
| JP | 2003-179489 | 6/2003 |
| JP | 2006-121171 | 5/2006 |

* cited by examiner

FIG.2

| VOLTAGE INFORMATION | PWM DUTY CYCLE (%) |
|---|---|
| 0 | 0% |
| ⋮ | ⋮ |
| 1.65 | 50% |
| ⋮ | ⋮ |
| 3.5 | 100% |

| TIME | VOLTAGE INFORMATION | PWM DUTY CYCLE (%) |
|---|---|---|
| $t_1$ | $v_1$ | $DutyC_1$ |
| . . . | . . . | . . . |
| $t_n$ | $v_n$ | $DutyC_n$ |

OSCILLATION FREQUENCY CONTROL CIRCUIT

This is a Continuation of PCT/JP2008/003108 filed Oct. 30, 2008 and published in Japanese, which has a priority of Japanese no. 2007-331767 filed Dec. 25, 2007, hereby incorporated by reference.

BACKGROUND OF THE INVENTION

1. Field of the Invention

The present invention relates to an oscillation frequency control circuit of an oscillator, and more particularly, to an oscillation frequency control circuit capable of correcting its own frequency in synchronization with an output signal, maintaining a stable oscillation frequency for a constant period even when a highly stable reference signal is not input thereto, and oscillating with a control voltage generated by making an external fixed voltage variable.

2. Description of the Related Art

In a base station of a next-generation mobile communication system, a terrestrial digital broadcasting system, and the like, the precision required for a frequency reference signal has become higher.

In order to generate a frequency reference signal, a cesium frequency reference oscillator, a rubidium frequency reference oscillator, a reference oscillator of a frequency synchronization type using a GPS signal, and the liker are used in broadcasting and communication systems.

However, since these oscillators are usually expensive, the reference signal from the oscillators is divided to be used as a reference signal source of an apparatus.

The divided reference signal is used as a reference clock for a communication system.

Specifically, the reference signal is used as a reference signal for phase comparison in a PLL (phase locked loop) circuit, a reference clock signal for a DSP (digital signal processor), an FPGA (field programmable gate array) or the like, and a sampling clock for a D/A (digital/analog) converter or an A/D (analog/digital) converter.

[Conventional PLL Circuit: FIG. 6]

Next, a description of a conventional PLL circuit will be provided with reference to FIG. 6. FIG. 6 is a configuration block diagram of a typical PLL circuit.

As illustrated in FIG. 6, the PLL circuit is provided with a phase comparator 32 configured to compare an external reference signal (Fref) with a 1/N divided signal to output a phase difference signal, a charge pump 33 configured to output the phase difference as a pulse width signal, a loop filter 34 configured to smooth out an output voltage from the charge pump 33, a voltage controlled crystal oscillator (VCXO) 35 configured to change a frequency in accordance with a control voltage from the loop filter 34 to oscillate and output a desired frequency (internal reference signal: output frequency), and a frequency divider (divider) 36 configured to divide the output (internal reference signal) of the VCXO 35 to 1/N.

The internal reference signal corresponds to an N*Fref signal.

The PLL circuit is configured to apply feedback control to the internal VCXO 35 so that a phase difference between an external reference signal and the output frequency of the VCXO 35 to thereby obtain an oscillator output synchronized with the reference signal.

Specifically, the phase comparator 32 is configured to compare phases of a highly stable external reference signal and an output signal from the VCXO 35 performing frequency control based on an input voltage and perform PLL control so that a DC voltage obtained by smoothing out a phase comparison result is fed back to the VCXO 35 to thereby generating a highly precise signal.

The PLL circuit is widely used in communication and broadcasting apparatuses and the like.

An example of the prior art of an oscillation frequency control circuit in the conventional oscillator is disclosed in Japanese Patent Application Laid-Open No. 2000-083003 (Patent Document 1) and Japanese Patent Application Laid-Open No. 2003-179489 (Patent Document 2).

Patent Document 1 discloses a free running frequency adjustment system in which a frequency counter performs a counting operation synchronized with an output signal of a VCO (voltage controlled oscillator) which is input within a period of time corresponding to a pulse width, a latch circuit stores therein a count value corresponding to an oscillation frequency of the VCO, and when the count value deviates from a predetermined range, a CPU changes an application voltage to the VCO to adjust a free-running frequency of the VCO 10 to be within a predetermined range.

Patent Document 2 discloses a phase locked loop circuit having a function of automatically adjusting a free-running frequency of a voltage-controlled oscillator (VCO), in which a microcomputer counts the number of pulses of a pulse signal output from the VCO in a period in which an output from a phase comparator is at a predetermined level and updates a control data based on the counted value, and a DAC (digital analog converter) converts the data to an analog signal so that the analog signal is combined with a signal from an LPF (low pass filter) to be used as a frequency control signal of the VCO.

Patent Document 1: Japanese Patent Application Laid-Open No. 2000-083003

Patent Document 2: Japanese Patent Application Laid-Open No. 2003-179489

However, in the conventional PLL circuit, since the phase comparison cannot be performed when a reference signal is not input thereto, the PLL circuit may switch over to another external reference signal or operate in a free-running state of the voltage-controlled oscillator. When it switches over to another external reference signal from a backup system, since PLL control is performed again, the deviation of the reference signal depends on the external reference signal, and therefore, it does not cause any problem. However, when it switches over to operate in the free-running state, the frequency is excessively controlled in response to a phase comparison result during the switching to stick to an upper or lower limit frequency, and thus, there is a problem that the frequency deviation becomes large.

As a short-term solution to solve the problem of the free running, a highly stable VC-TCXO (voltage controlled-temperature compensated crystal oscillator) may be used as the voltage-controlled oscillator.

However, although such a solution allows operation with a frequency stability of e.g., ±0.5 ppm, it might not be able to provide satisfactory performance for a long period of time due to aging.

For example, when it is assumed that aging characteristics are about ±1 ppm per year, a frequency deviation may amount to maximum 10.5 ppm at the elapse of 10 years. This may also be explained that if an output frequency of a carrier wave in communication is 800 MHz, a frequency deviation may amount to 8.4 kHz similar to that of the reference frequency. Such a frequency deviation is not allowable to a system.

Moreover, even in a highly stable system using a VCOCXO (voltage controlled, oven controlled crystal oscillator), since the aging characteristics may cause a frequency deviation in a long period of time, it is necessary to perform a correction operation every predetermined period of time, and therefore, there was a problem that the correction operation is troublesome.

Moreover, the system or circuit disclosed in Patent Document 1 or 2 counts the output of the VCO or the output of the phase comparator to perform adjustment of the free-running frequency. However, the system or circuit does not perform the frequency adjustment by directly detecting an abnormality of the external reference signal and is unable to sufficiently cope with the aging.

[Control Voltage Characteristics of VCXO: FIG. 7]

The control voltage characteristics of the VCXO are shown in FIG. 7. FIG. 7 is a view showing exemplary control voltage characteristics of a voltage controlled crystal oscillator. In FIG. 7, the horizontal axis represents a control voltage, and the vertical axis represents a frequency deviation.

In the example VCXO of FIG. 7, the VCXO is able to operate when the control voltage is in the range of 0 to 4 V, while it is unable to operate when the control voltage is 4 V or more.

Since the frequency deviation rises with the lapse of time even in the case of the VCXO, an appropriate control voltage changes accordingly.

[Free-Running Characteristics: FIG. 8]

Further, free-running characteristics of the VCXO are shown in FIG. 8. FIG. 8 is a graph illustrating the free-running characteristics of the VCXO.

Even in the case of the VCXO, since frequency deviation increases with the passage of time, an appropriate control voltage changes. It is likewise applied to a temperature compensated crystal oscillator.

[Frequency Characteristics: FIG. 9]

Next, frequency characteristics when an external reference signal is a highly stable signal from a rubidium oscillator and the like are shown in FIG. 9. FIG. 9 is a graph illustrating frequency characteristics when the external reference signal is a highly stable signal.

As shown in FIG. 9, when the external reference signal is a highly stable signal from a rubidium oscillator and the like, frequency deviation occurs in the range allowable to a system regardless of the passage of time.

[Frequency Characteristics when External Reference Signal is Interrupted: FIG. 10]

Further, frequency characteristics when the external reference signal is interrupted are shown in FIG. 10. FIG. 10 is a graph illustrating the frequency characteristics when the external reference signal is interrupted.

According to the frequency characteristics when the external reference signal is interrupted as shown in FIG. 10, after frequency deviation significantly increases at the time of connection interruption, the frequency deviation gradually increases with the passage of time. If periodic correction is not performed, the frequency deviation may exceed the frequency range allowable to a system.

Further, some base stations may not obtain the external reference signal. In such a case, instead of the PLL circuit, an oscillator with a different configuration capable of oscillating with a fixed voltage is necessary, and oscillation control circuits corresponding to base stations must be prepared.

SUMMARY OF THE INVENTION

In view of such circumstances, it is an object of the present invention to provide an oscillation frequency control circuit capable of correcting its own frequency, maintaining a stable oscillation frequency even when a highly stable reference signal is not input thereto and it operates in a free-running state, and oscillating with a control voltage generated by making an external fixed voltage variable.

To solve the problems of the above conventional examples, according to the present invention, there is provided an oscillation frequency control circuit comprising: a voltage-controlled oscillator; a divider configured to divide an output from the voltage-controlled oscillator; a phase comparator configured to compare phases of an external reference signal and an output from the divider and output a phase difference signal; a loop filter configured to smooth out an output from the phase comparator and output the smoothed output; a detection circuit configured to detect the external reference signal; a pulse generation circuit configured to generate pulses upon receipt of pulse generation information and output the generated pulses to the loop filter; a memory configured to store control voltage information and the pulse generation information corresponding to the control voltage information; a control voltage variable circuit configured to perform adjustment of changing a fixed voltage; a select switch configured to turn on/off a connection between the phase comparator and the loop filter; and a control unit configured to turn on the select switch when a level of the external reference signal detected by the detection circuit is within an appropriate range while turning off the select switch when the level is outside the appropriate range, and in the case of selecting a control voltage from the control voltage variable circuit, to output a command for selecting the control voltage to the pulse generation circuit, and in the case of not selecting the control voltage from the control voltage variable circuit, to output the pulse generation information stored in the memory to the pulse generation circuit, wherein the select switch turns off the connection between the phase comparator and the loop filter and selects the control voltage to output the control voltage to the loop filter upon receipt of a control signal for selecting the control voltage input from the control voltage variable circuit, turns on the connection between the phase comparator and the loop filter upon receipt of a control signal for selecting the external reference signal, and turns off the connection between the phase comparator and the loop filter upon receipt of a control signal for selecting the pulses from the pulse generation circuit, and wherein the control unit outputs the control signal for selecting the external reference signal to turn on the select switch when the level of the external reference signal detected by the detection circuit is within the appropriate range, and outputs any one of the control signal set in advance for selecting the control voltage from the control voltage variable circuit and the control signal set in advance for selecting the pulses from the pulse generation circuit to the select switch when the level of the external reference signal is outside the appropriate range in the state in which the select switch is turned on. Consequently, it is possible to correct its own frequency and, in advance, oscillate with a control voltage generated by making an external fixed voltage variable, or to maintain a stable oscillation frequency by using the pulse from the pulse generation circuit when a highly stable reference signal is not input thereto and it operates in a free-running state.

In the oscillation frequency control circuit according to the present invention, the control voltage information stored in the memory is a value of a center control voltage of a control voltage capable of controlling the voltage-controlled oscillator, so that it is possible to correct its own frequency and maintain the stable oscillation frequency.

In the oscillation frequency control circuit according to the present invention, the memory stores an aging characteristics table, instead of the control voltage information and the pulse generation information corresponding to the control voltage information, the table storing a control voltage appropriate for an aging time and pulse generation information corresponding to the control voltage, and the control unit measures time by means of a timer provided therein, retrieves the control voltage corresponding to the measured time from the aging characteristics table of the memory when the level of the external reference signal is outside the appropriate range, reads the pulse generation information corresponding to the retrieved control voltage, and then outputs the pulse generation information to the pulse generation circuit. Consequently, frequency correction can be allowed to correspond to aging.

In the oscillation frequency control circuit according to the present invention, the oscillation frequency control circuit further includes a level detection circuit configured to detect a voltage level of an output from the loop filter to thereby output the latest voltage information to the control unit, and the memory stores the latest voltage information and a voltage and pulse generation information table instead of the control voltage information and the pulse generation information corresponding to the control voltage information, the table storing a plurality of pieces of voltage information and pulse generation information corresponding to the plurality of pieces of voltage information, and the control unit updates the latest voltage information of the memory into the latest voltage information input from the level detection circuit, reads the pulse generation information corresponding to the latest voltage information from the voltage and pulse generation information table of the memory when the level of the external reference signal is outside the appropriate range, and then outputs the pulse generation information to the pulse generation circuit. Consequently, even when the highly stable reference signal is not input thereto and it operates in a free-running state, the state until that time is taken over and the stable oscillation frequency can be maintained.

In the oscillation frequency control circuit according to the present invention, a voltage controlled crystal oscillator, a temperature-compensated crystal oscillator, or a voltage controlled oven controlled crystal oscillator is used instead of the voltage-controlled oscillator.

Further, in the oscillation frequency control circuit according to the present invention, the pulse generation circuit is a pulse width modulation circuit, and the pulse generation information output from the control unit is information on a pulse width modulation duty cycle.

BRIEF DESCRIPTION OF THE DRAWING

FIG. 2 is a schematic view of a voltage and PWM duty cycle table.

DESCRIPTION OF REFERENCE NUMERALS

Figure 1:
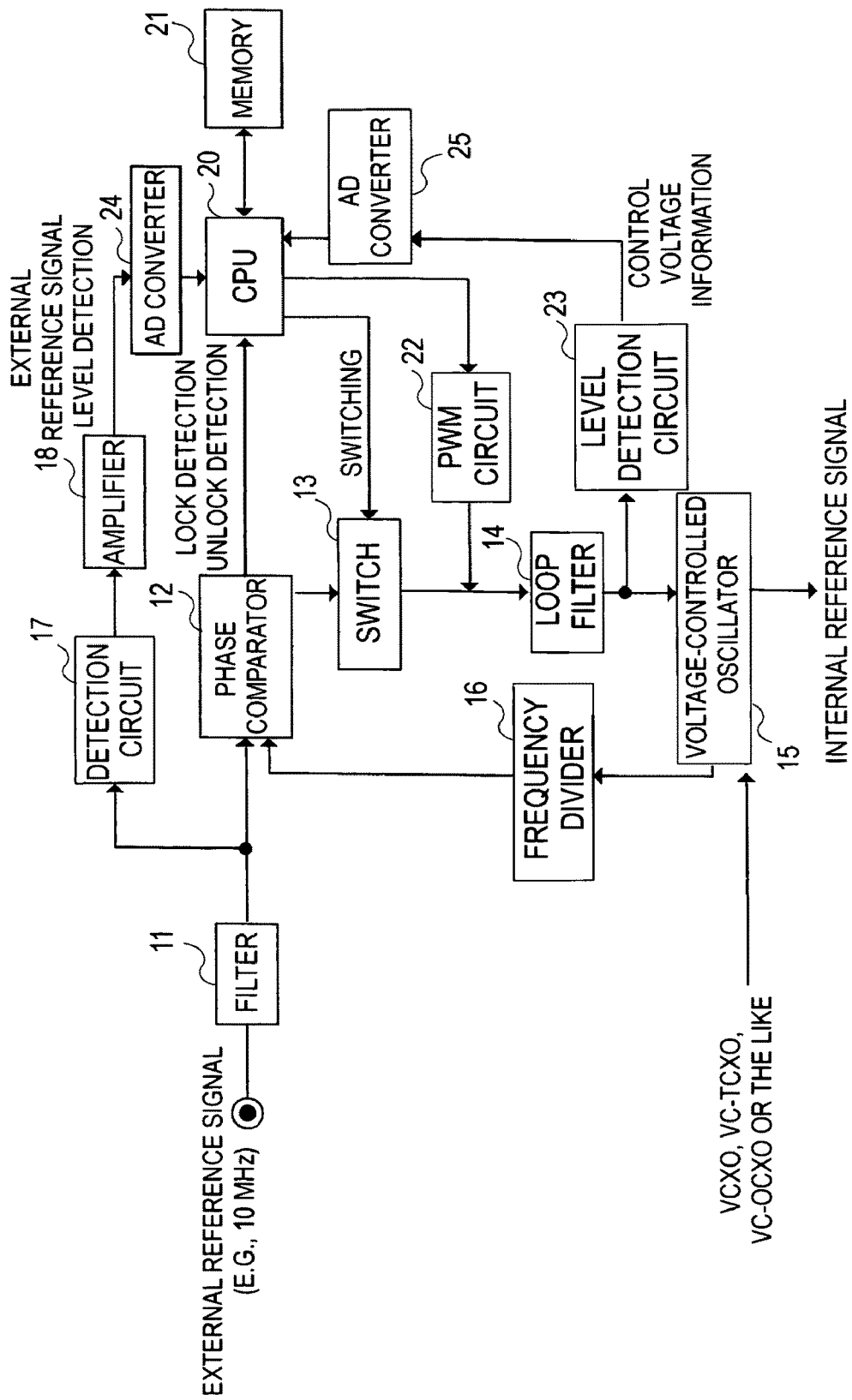
FIG. 1 is a configuration block diagram of an oscillation frequency control circuit according to an embodiment of the present invention.

11 . . . FILTER, 12 . . . PHASE COMPARATOR, 13 . . . SELECT SWITCH, 14 . . . LOOP FILTER, 15 . . . VOLTAGE-CONTROLLED OSCILLATOR, 16 . . . FREQUENCY DIVIDER, 17 . . . DETECTION CIRCUIT, 18 . . . AMPLIFIER, 20 . . . CPU, 21 . . . MEMORY, 22 . . . PWM CIRCUIT, 23 . . . LEVEL DETECTION CIRCUIT, 24 . . . AD CONVERTER, 25 . . . AD CONVERTER, 26 . . . control voltage variable circuit, 32 . . . PHASE COMPARATOR, 33 . . . CHARGE PUMP, 34 . . . LOOP FILTER, 35 . . . VCXO, 36 . . . FREQUENCY DIVIDER

DESCRIPTION OF THE PREFERRED EMBODIMENT

Outline of Embodiment

Hereinafter, an embodiment of the present invention will be described with reference to the accompanying drawings.

An oscillation frequency control circuit according to the embodiment of the present invention includes: a voltage-controlled oscillator; a divider configured to divide an output from the voltage-controlled oscillator; a phase comparator configured to compare phases of an external reference signal and an output from the divider and output a phase difference signal; a loop filter configured to smooth out an output from the phase comparator and output the smoothed output; a detection circuit configured to detect the external reference signal; a pulse generation circuit configured to generate pulses upon receipt of pulse generation information and output the pulses to the loop filter; a memory configured to store control voltage information and the pulse generation information corresponding to the control voltage information; a control voltage variable circuit configured to perform adjustment of changing a fixed voltage; a select switch configured to select a control voltage to output the control voltage to the loop filter upon receipt of a control signal for selecting the control voltage input from the control voltage variable circuit, and turn on/off the connection between the phase comparator and the loop filter when selection of the control voltage is not performed; and a control unit configured to output a control signal for preferentially selecting the control voltage to the upon receipt of a command for selecting the control voltage from the control voltage variable circuit, turn on the select switch if a level of the external reference signal detected by the detection circuit is within an appropriate range when the command is not input, and turn off the select switch to output the pulse generation information stored in the memory to the pulse generation circuit if the level of the external reference signal is outside an appropriate range. Consequently, it is possible to correct its own frequency, maintain a stable oscillation frequency even when a highly stable reference signal is not input thereto and it operates in a free-running state, and oscillate with a control voltage generated by making an external fixed voltage variable.

Further, according to the present invention, an oscillation frequency control circuit includes: a voltage-controlled oscillator; a divider configured to divide an output from the voltage-controlled oscillator; a phase comparator configured to compare phases of an external reference signal and an output from the divider and output a phase difference signal; a loop filter configured to smooth out an output from the phase comparator and output the smoothed output; a detection circuit configured to detect the external reference signal; a pulse generation circuit configured to generate pulses upon receipt of pulse generation information and output the pulses to the loop filter; a memory configured to store control voltage information and the pulse generation information corresponding to the control voltage information; a control voltage variable circuit configured to perform adjustment of changing a fixed voltage; a select switch configured to select the control voltage to output the control voltage to the loop filter upon receipt of a control signal for selecting the control voltage input from the control voltage variable circuit, turn on the connection between the phase comparator and the loop filter upon receipt of a control signal for selecting the external reference signal, and turn off the connection between the phase comparator and the loop filter upon receipt of a control signal for selecting the pulses from the pulse generation circuit; and a control unit configured to output the control signal for selecting the external reference signal to turn on the select switch when a level of the external reference signal detected by the detection circuit is within an appropriate range, and output any one of the control signal set in advance for selecting the control voltage from the control voltage variable circuit and the control signal set in advance for selecting the pulses from the pulse generation circuit to the select switch when the level of the external reference signal is outside the appropriate range. Consequently, it is possible to correct its own frequency and, in advance, oscillate with a control voltage generated by making an external fixed voltage variable, or to maintain a stable oscillation frequency by using the pulse from the pulse generation circuit when a highly stable reference signal is not input thereto and it operates in a free-running state.

In addition, in the oscillation frequency control circuit according to the embodiment of the present invention, the memory stores an aging characteristics table that stores a control voltage appropriate for an aging time and pulse generation information corresponding to the control voltage, and the control unit measures time by means of a timer provided therein, retrieves the control voltage corresponding to the measured time from the aging characteristics table of the memory when the level of the external reference signal is outside the appropriate range, reads the pulse generation information corresponding to the retrieved control voltage, and then outputs the pulse generation information to the pulse generation circuit. Consequently, frequency deviation can be allowed to correspond to aging.

Moreover, according to the embodiment of the present invention, the oscillation frequency control circuit further includes a level detection circuit configured to detect a voltage level of an output from the loop filter to thereby output latest voltage information to the control unit, and the memory stores the latest voltage information and a voltage and pulse generation information table instead of the control voltage information and the pulse generation information corresponding to the control voltage information, the table storing a plurality of pieces of voltage information and pulse generation information corresponding to the plurality of pieces of voltage information, and the control unit updates the latest voltage information of the memory into the latest voltage information input from the level detection circuit, reads the pulse generation information corresponding to the latest voltage information from the voltage and pulse generation information table of the memory when the level of the external reference signal is outside the appropriate range, and then outputs the pulse generation information to the pulse generation circuit. Consequently, even when the highly stable reference signal is not input thereto and it operates in a free-running state, the state until that time is taken over and the stable oscillation frequency can be maintained.

[Oscillation Frequency Control Circuit: FIG. 1]

A description of an oscillation frequency control circuit according to an embodiment of the present invention will be provided with reference to FIG. 1. FIG. 1 is a configuration block diagram of an oscillation frequency control circuit according to an embodiment of the present invention.

The oscillation frequency control circuit (present circuit) according to the embodiment of the present invention, as shown in FIG. 1, includes a filter 11, a phase comparator 12, a select switch 13, a loop filter 14, a voltage-controlled oscillator 15, a frequency divider 16, a detection circuit 17, an amplifier 18, a CPU (central processing unit) 20, a memory 21, a PWM (pulse width modulation) circuit 22, a level detection circuit 23, an AD converter 24, an AD converter 25, and a control voltage variable circuit 26.

[Each Part of Present Circuit]

The filter 11 is a filter configured to limit a band of an external reference signal having a frequency of e.g., 10 MHz. The filter 11 has a function of rejecting a high-frequency component of the external reference signal, although the function is not essential as a basic configuration.

The phase comparator 12 is configured to compare phases of a reference signal output from the filter 11 and a signal of which the frequency is divided by the frequency divider 16 to thereby output a phase difference signal.

Moreover, the phase comparator 12 is configured to compare the phases of the external reference signal and the frequency-divided signal to thereby output a lock detection signal to the CPU 20 when a synchronization (lock) has been detected, while outputting an unlock detection signal to the CPU 20 when an asynchronism (unlock) has been detected.

The select switch 13 switches a fixed voltage mode A in which a fixed voltage from the control voltage variable circuit 26 is supplied to a loop filter 14 in accordance with a switching command (a switching control signal) from the CPU 20, an external reference signal mode B in which the external reference signal is supplied by turning on a connection between the phase comparator 12 and the loop filter 14, and an internal voltage mode C in which a voltage from the PWM circuit 22 is supplied by turning off the connection between the phase comparator 12 and the loop filter 14.

That is, the select switch 13 receives the switching control signal for selecting any one of the fixed voltage mode A, the external reference signal mode B and the internal voltage mode C from the CPU 20.

The CPU 20 normally outputs the switching control signal for selecting the external reference signal mode B, and outputs the switching control signal for selecting the internal voltage mode C in an abnormal state in which the external reference signal is not input.

Further, although not shown in FIG. 1, if a command for selecting the fixed voltage mode A is input to the CPU 20 from an input unit, the CPU 20 preferentially outputs the switching control signal for selecting the fixed voltage mode A. That is, the select switch 13 operates in the external reference signal mode B so long as the switching control signal of the fixed voltage mode A is not input, and switches the external reference signal mode B into the internal voltage mode C in an abnormal state.

The loop filter 14 is a filter configured to smooth out an output voltage from the phase comparator 12: that is, the filter smoothes out a control voltage to be input to the voltage-controlled oscillator 15.

The voltage-controlled oscillator 15 is configured to change a frequency in accordance with the control voltage from the loop filter 14 to oscillate and output a desired frequency (internal reference signal).

Moreover, a voltage controlled crystal oscillator (VCXO), VC-TCXO, or a voltage controlled, oven controlled crystal oscillator (VC-OCXO) may be used in lieu of the voltage-controlled oscillator (VCO).

The frequency divider 16 is configured to divide the internal reference signal output from the voltage-controlled oscillator 15 to 1/N.

The detection circuit 17 is configured to detect a level of the output signal from the filter 11.

The amplifier 18 is configured to amplify a signal detected by the detection circuit 17.

If the command for selecting the fixed voltage mode A is input from the input unit, the CPU 20 outputs the switching control signal for selecting the fixed voltage mode A to the select switch 13. If the command for selecting the fixed voltage mode A is not input from the input unit, when it is determined that the current state is a normal state which will be described below, the CPU 20 outputs the switching control signal for selecting the external reference signal mode B to the select switch 13. In addition, when it is determined that the current state is an abnormal state which will be described below, the CPU 20 outputs the switching control signal for selecting the internal voltage mode C to the select switch 13.

The CPU 20 is configured to receive a control voltage information from the AD converter 25 and store the control voltage information in the memory 21 as a latest control voltage information. Specifically, the CPU 20 always receives the control voltage information from the AD converter 25, and when the received control voltage information has not been changed from a previous control voltage information, the control voltage information stored in the memory 21 is not updated, while when the received control voltage information has been changed from the previous control voltage information, the control voltage information of the memory 21 is updated.

Further, upon receipt of the detection level of the external reference signal (external REF) from the AD converter 24, the CPU 20 determines whether the detection level is within an appropriate range (ranging from a first threshold value to a second threshold value) stored in the memory 21, and outputs a turn-on command (command for turning on the connection between the phase comparator 12 and the loop filter 14) to the switch 13 when it is within the appropriate range while outputting a turn-off command (command for turning off the connection between the phase comparator 12 and the loop filter 14) to the switch 13 when it is outside the appropriate range.

Furthermore, when the detection level of the external REF is outside the appropriate range, the CPU 20 refers to a voltage and PWM duty cycle table stored in the memory 21 and outputs a pulse width information corresponding to a PWM duty cycle based on a voltage information of a present (latest) control voltage to the PWM circuit 22.

The memory 21 stores therein the latest control voltage information, the first and second threshold values serving as a basis of the appropriate range for the detection level of the external REF, and the voltage and PWM duty cycle table.

The control voltage information is updated in the memory 21 when a change has been detected by the level detection circuit 23, so that a latest value can be maintained.

[Voltage and PWM Duty Cycle Table: FIG. 2]

A description of the voltage and PWM duty cycle table will be provided below with reference to FIG. 2. FIG. 2 is a schematic view of the voltage and PWM duty cycle table.

As shown in FIG. 2, the voltage and PWM duty cycle table stores a PWM duty cycle (%) for specifying a pulse width for a voltage information.

Here, the voltage information is used to predetermine a PWM duty cycle of pulses output from the PWM circuit 22 to the loop filter 14 in order to maintain a value (control voltage information) of the control voltage from the loop filter 14.

Therefore, when a PWM duty cycle corresponding to the control voltage information detected by the level detection circuit 23 is read from the voltage and PWM duty cycle table and the PWM circuit 22 outputs pulses corresponding to the cycle to the loop filter 14, the same control voltage as the previous one is output from the loop filter 14 to the voltage-controlled oscillator 15.

The PWM circuit 22 performs pulse width modulation on data of the PWM duty cycle input from the CPU 20 to thereby output a desired pulse signal to the loop filter 14. A D/A (digital/analog) converter may be used in lieu of the PWM circuit as long as the data of the voltage information can be output from the CPU 20.

The level detection circuit 23 is configured to detect a DC voltage output from the loop filter 14 to output the detected voltage to the AD converter 25 as the control voltage information.

The AD converter 24 is configured to convert an analog signal of the detection level of the external REF output from the amplifier 18 to a digital signal to be output to the CPU 20.

The AD converter 25 is also configured to convert an analog signal of the control voltage information from the level detection circuit 23 to a digital signal to be output to the CPU 20.

In the present circuit, since the CPU 20 is capable of perceiving an input abnormality of the external reference signal from the detection level of the external REF output from the detection circuit 17 and the amplifier 18, an unlock detection signal from the phase comparator 12 is not used.

[Operation of Present Circuit]

Hereinafter, the operation of the present circuit will be described.

According to the present circuit, if the command for selecting the fixed voltage mode A is input from the input unit, the CPU 20 outputs the switching control signal for selecting the fixed voltage mode A to the select switch 13, so that the voltage from the control voltage variable circuit 26 is output to the loop filter 14. The voltage-controlled oscillator 15 receives the voltage from the control voltage variable circuit 26 through the loop filter 14, and performs an oscillation operation in response to the received voltage.

Further, if the command for selecting the fixed voltage mode A is not input from the input unit, the CPU 20 outputs the switching control signal for selecting the external reference signal mode B to the select switch 13 in a normal state, so that the select switch 13 allows the phase comparator 12 and the loop filter 14 to be in a connected state.

Thus, the phase comparator 12 outputs the phase difference signal of the external reference signal and the signal from the divider 16 to the voltage-controlled oscillator 15 via the loop filter 14, and controls an oscillation frequency of the voltage-controlled oscillator 15. At this time, the level detection circuit 23 detects a latest control voltage to output the latest control voltage to the CPU 20 via the AD converter 25, and the CPU 20 updates the latest control voltage information stored in the memory 21 when the control voltage information has been changed.

Moreover, in the present circuit, the external reference signal is detected by the detection circuit 17 and amplified by the amplifier 18 so that the level of the external REF is detected and output to the CPU 20 via the AD converter 24.

In the CPU 20, a determination is made as to whether the detection level of the external REF is within the appropriate range. Specifically, the value of the detection level of the external REF is determined to be within the appropriate range when the value is between the first threshold value and the second threshold value representing the appropriate range stored in the memory 21. On the other hand, the value of the detection level of the external REF is determined to be outside the appropriate range when the value is not between the first threshold value and the second threshold value.

When the determination result shows that the detection level is within the appropriate range, the CPU 20 operates in a normal state to allow the select switch 13 to be in the turn-on state (the external reference signal mode) so that the phase comparator 12 and the loop filter 14 are in a connected state. When the determination result shows that the detection level is outside the appropriate range, the CPU 20 operates in an abnormal state to allow the select switch 13 to be in the turn-off state (the internal voltage mode) so that the phase comparator 12 and the loop filter 14 are in a disconnected state, thereby cutting off the connection between the phase comparator 12 and the loop filter 14.

Furthermore, in the abnormal operation state, the CPU 20 reads out the latest control voltage information stored in the memory 21, reads the PWM duty cycle corresponding to the voltage information from the voltage and PWM duty cycle table, and outputs information (data) for forming pulses corresponding to the PWM duty cycle to the PWM circuit 22.

The PWM circuit 22 generates pulses in accordance with the pulse generation information input from the CPU 20 and output the control voltage to the voltage-controlled oscillator 15 via the loop filter 14.

In this manner, when an abnormality has occurred in the external reference signal, particularly, when the external reference signal is not input thereto (the free-running state), or the like, the CPU 20 immediately detects the abnormality from the output from the detection circuit 17 in the amplifier 18 and cuts off the output of the phase comparator 12, so that the same pulses as the previous control voltage which has been used for controlling the voltage-controlled oscillator 15 can be output from the PWM circuit 22.

That is, by utilizing the output from the PWM circuit 22 in lieu of the output from the phase comparator 12, it is possible to appropriately control the frequency oscillation at the voltage-controlled oscillator 15 by succeeding the previous operation state.

Further, according to the present circuit, it is possible to cope with both a base station, which obtains the external reference signal, and a base station, which does not obtain the external reference signal, by using one circuit.

Thus, in the case of the base station which obtains the external reference signal, it is possible to correct its own frequency, maintain a stable oscillation frequency even when a highly stable reference signal is not input thereto and it operates in a free-running state, and oscillate with a control voltage generated by making an external fixed voltage variable.

[Different Mode Selection in Present Circuit]

In the present circuit, the CPU 20 preferentially selects the fixed voltage mode A. However, after the external reference signal mode B is selected in a normal state, the internal voltage mode C or the fixed voltage mode A to be selected when an abnormal state occurs may be set in advance in the CPU 20 or the memory 21, and the switching control signal for selecting any one of the modes set to be selected in the abnormal state may be output.

Further, in the present circuit having performed the different mode selection, it is possible to correct its own frequency and, in advance, oscillate with a control voltage generated by making an external fixed voltage variable, or to maintain a stable oscillation frequency by using the pulse from the pulse generation circuit when a highly stable reference signal is not input thereto and it operates in a free-running state.

Another Embodiment 1

In the example described above, although the pulses output from the PWM circuit 22 were generated based on the latest control voltage information detected by the level detection circuit 23, a default voltage information may be stored so that the pulse generation information may be output based on the PWM duty cycle corresponding to the default voltage information.

Specifically, the memory 21 stores therein a center voltage value within the appropriate range, of the control voltage of the voltage-controlled oscillator 15. Since the PWM duty cycle corresponding to the center voltage value is 50%, if the control voltage of the voltage-controlled oscillator 14 ranges from 0 to 3.3 V, the center control voltage is set to 3.3/2 V. Moreover, an arbitrary voltage value other than the center voltage value may be stored so that a control voltage is set to a voltage corresponding to the voltage value.

When a default voltage information is used, it is possible to omit components such as the level detection circuit 23 and the AD converter 25 and the voltage and PWM duty cycle table in the memory 21.

Figure 3:
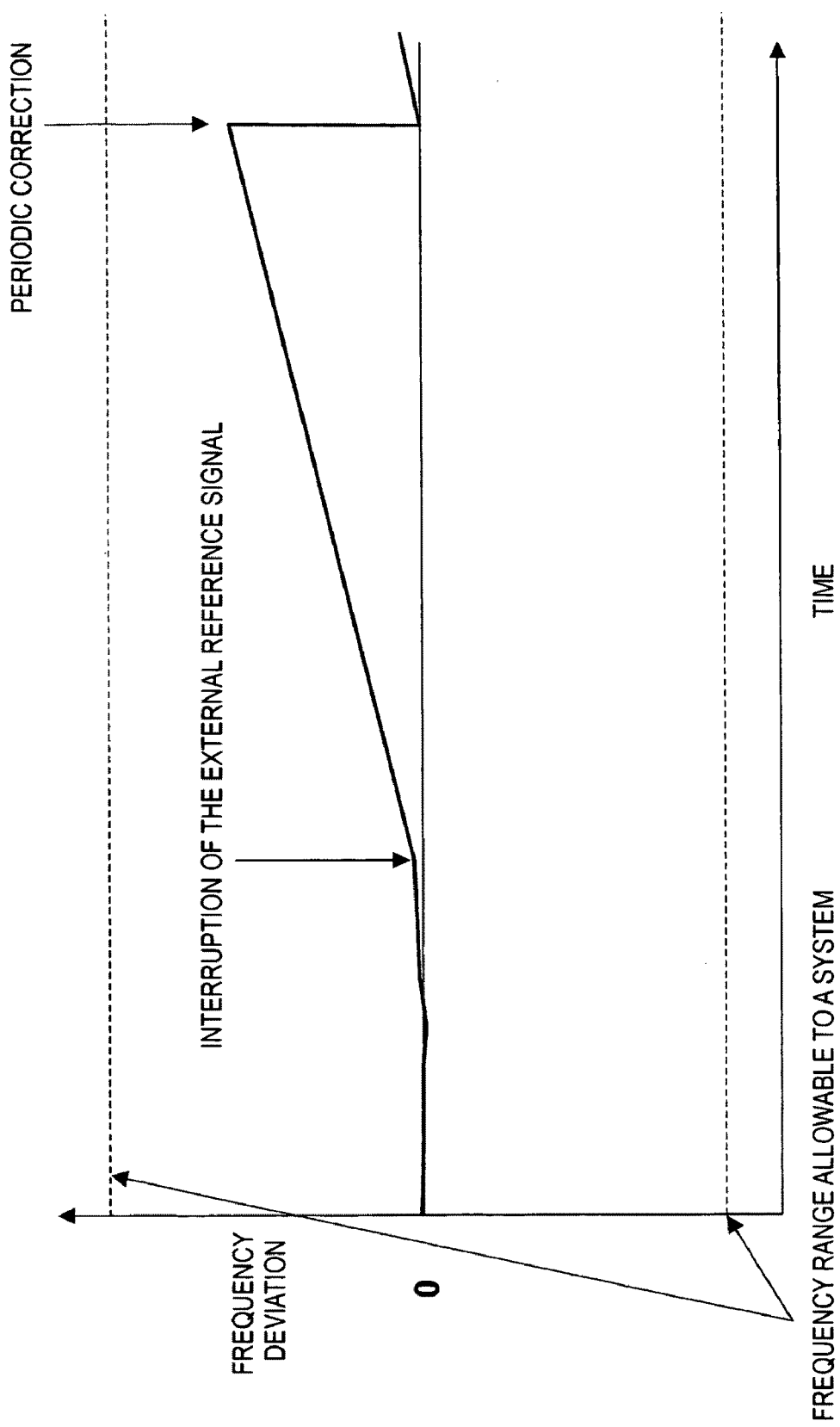
FIG. 3 is a view showing characteristics during correction.

[Characteristics During Correction: FIG. 3]

A correction operation of the present circuit will be described with reference to FIG. 3. FIG. 3 is a graph illustrating characteristics during correction.

In the present circuit, if time elapses in a state where the external reference signal is not input thereto as shown in FIG. 3, the frequency deviation gradually increases or decreases. FIG. 3 shows that the frequency deviation increases. Therefore, when an appropriate reference signal is input at a specific timing and then the input of the reference signal is stopped, the correction is made such that the frequency deviation returns to the center frequency by free-running control.

In this correction, the frequency control is carried out by using a center voltage value within a range capable of controlling the control voltage of the voltage-controlled oscillator 15.

In accordance with the present circuit, it is possible to provide an advantage that the correction operation can be performed without connecting a special circuit during the correction.

Figures 4, 5:
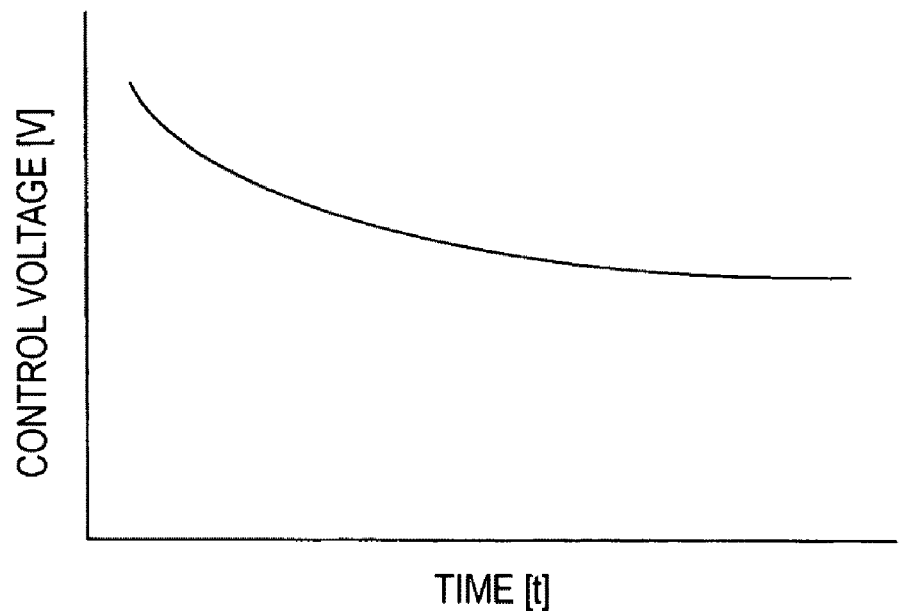
FIG. 4 is a view showing aging and control voltage characteristics.
FIG. 5 is a schematic view of an aging characteristics table.
Figure 6:
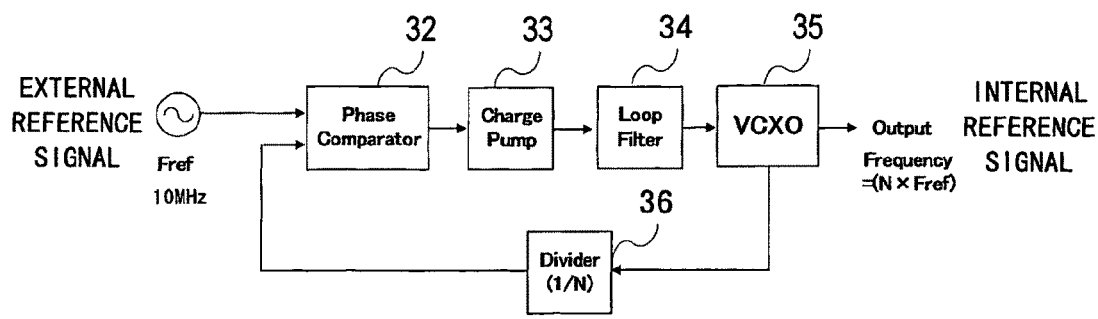
FIG. 6 is a configuration block diagram of a typical PLL circuit.
Figure 7:
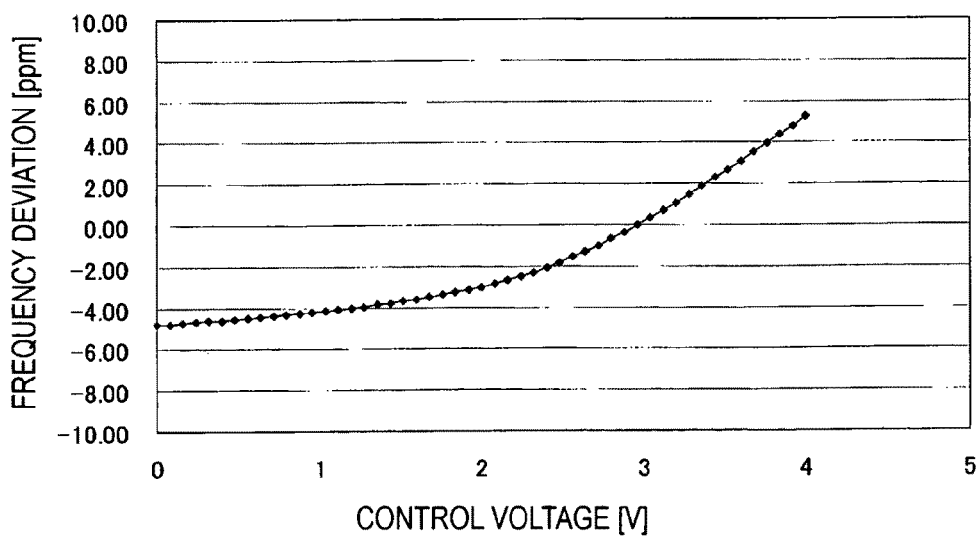
FIG. 7 is a view showing exemplary control voltage characteristics of a voltage controlled crystal oscillator.
Figure 8:
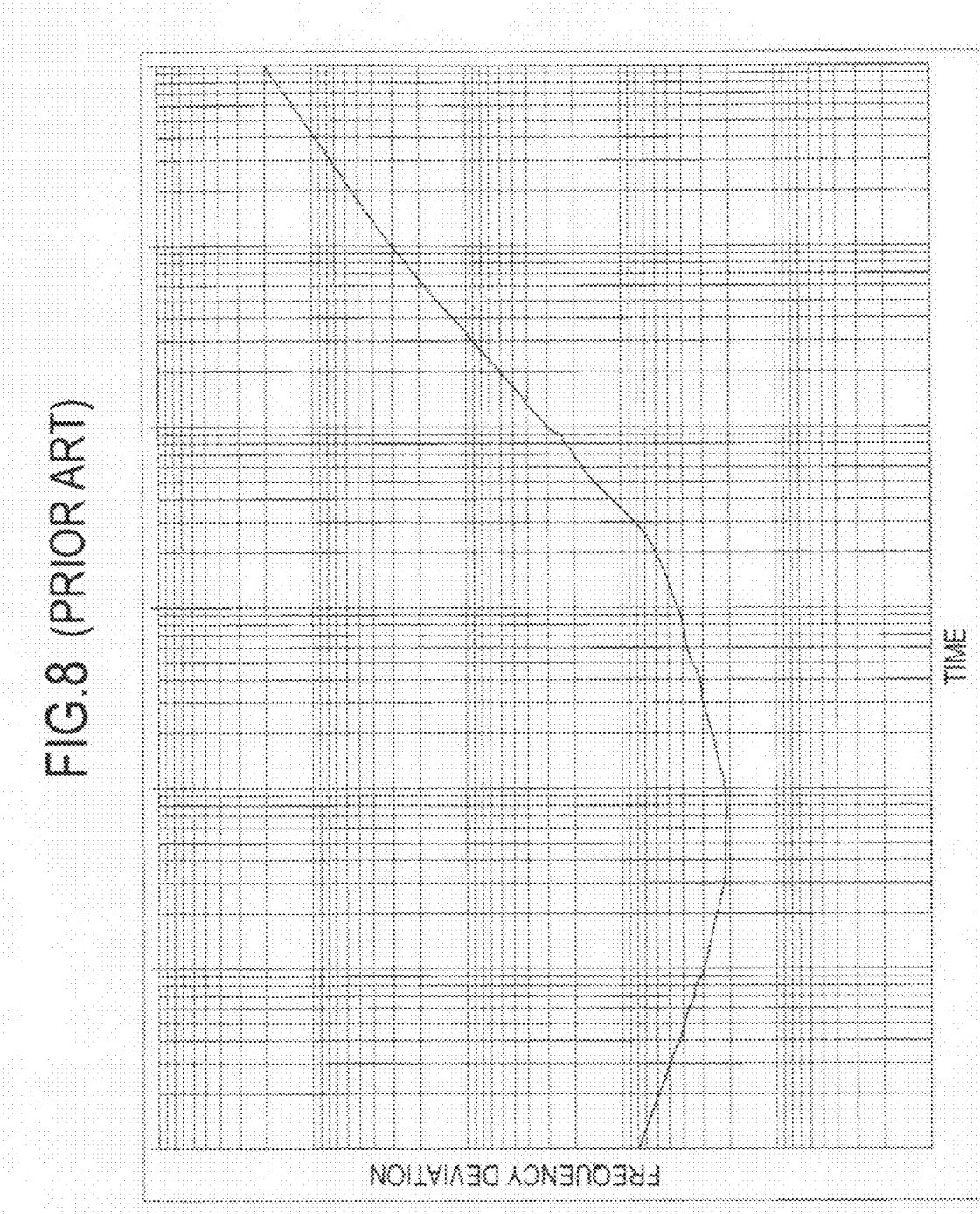
FIG. 8 is a graph illustrating free-running characteristics of a VCXO.
Figure 9:
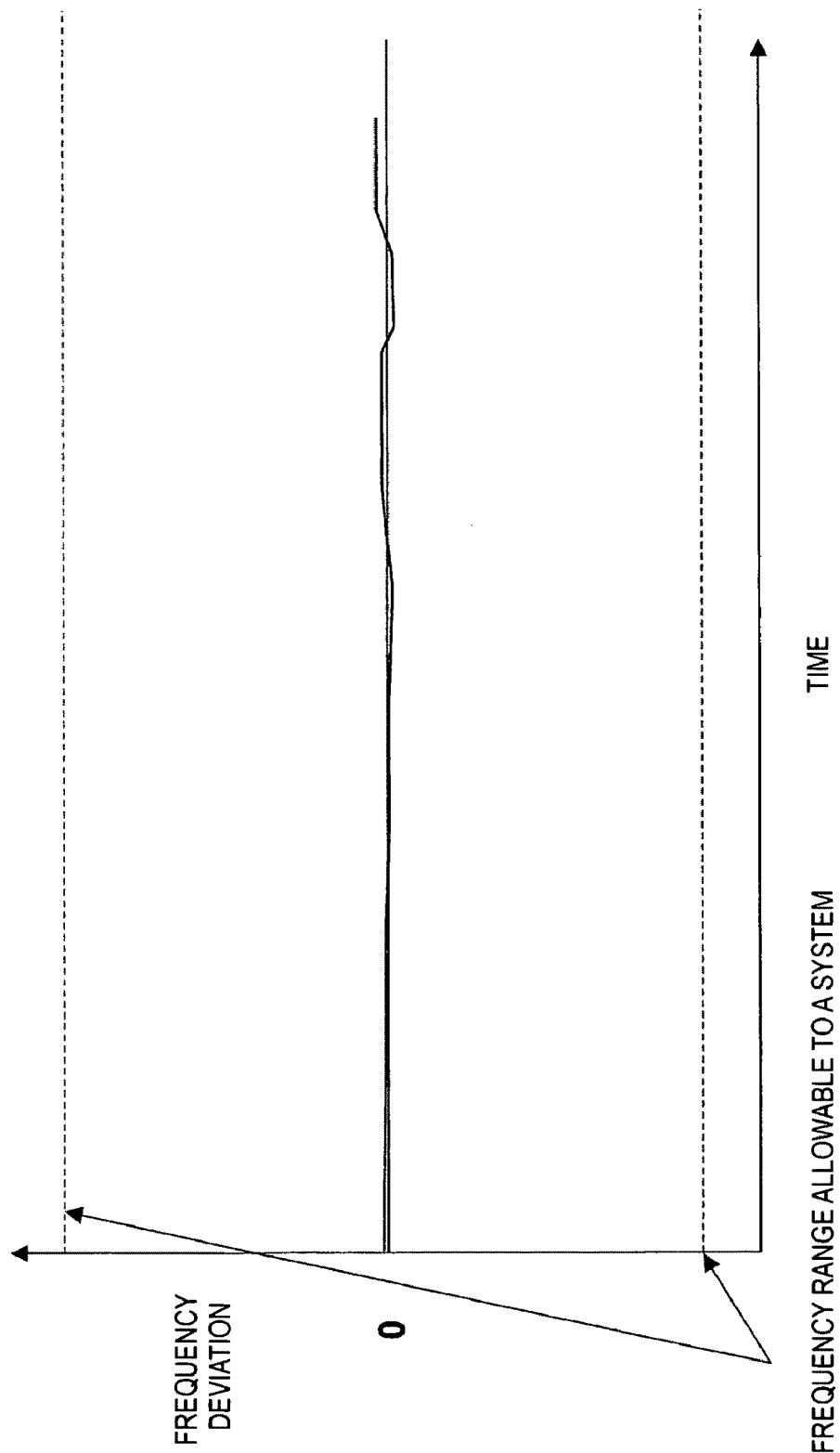
FIG. 9 is a graph illustrating frequency characteristics when an external reference signal is a highly stable signal.
Figure 10:
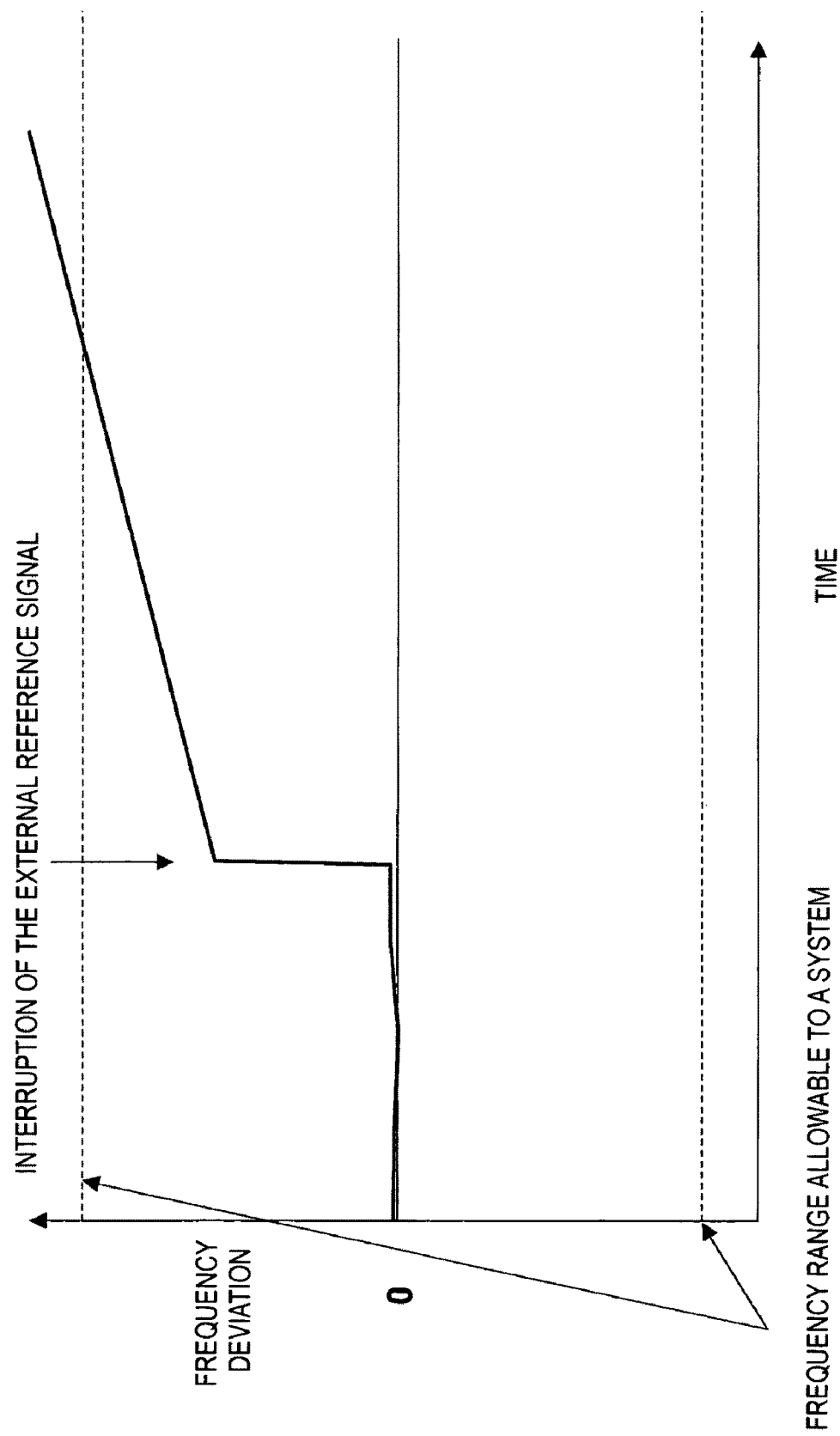
FIG. 10 is a graph illustrating frequency characteristics when an external reference signal is interrupted.

[Voltage Characteristics with Aging: FIG. 4]

Next, an example of optimum control voltage characteristics with aging in the present circuit is shown in FIG. 4. FIG. 4 is a view showing aging and control voltage characteristics.

As shown in FIG. 4, in the present circuit, the optimum control voltage decreases with the elapse of time (however, this corresponds to a case where the frequency deviation is rising).

Another Embodiment 2

In a still further embodiment (another embodiment 2), the present circuit is configured to cope with the aging. Another embodiment 2 will be described with reference to FIG. 5. FIG. 5 is a schematic view of an aging characteristics table.

Although the memory 21 stores therein the voltage and PWM duty cycle table, the present circuit uses the aging characteristics table shown in FIG. 5 in lieu of the voltage and PWM duty cycle.

[Aging Characteristics Table: FIG. 5]

The aging characteristics table of FIG. 5 incorporates a time factor into the relationship between the voltage information and the PWM duty cycle.

Specifically, a voltage information which is appropriately set for a given elapse time and a PWM duty cycle corresponding to the voltage information are stored as a table.

The CPU 20 measures an elapse time by means of a timer provided therein.

In another embodiment 2, when the detection level of the external reference signal is outside the appropriate range, the CPU 20 turns off the select switch 13, refers to the time measured by the internal timer to retrieve the PWM duty cycle from the voltage information corresponding to the time, and outputs a pulse generation information corresponding to the PWM duty cycle to the PWM circuit 22. Then, the PWM circuit 22 generates desired pulses and outputs the control voltage to the voltage-controlled oscillator 15 via the loop filter 14.

In this manner, in another embodiment 2, upon occurrence of an abnormality of the external reference signal, the CPU 20 corrects the oscillation frequency using the pulses generated in accordance with the voltage information corresponding to the aging and the PWM duty cycle corresponding to the voltage information. Therefore, it is possible to provide an advantage that the frequency control circuit can cope with the aging.

Moreover, in the circuit configuration of another embodiment 2, a correction operation may be performed.

In this case, the CPU 20 measures an elapse time, and during the correction, performs frequency control by using a voltage value corresponding to the elapse time by referring to the aging characteristics table. Therefore, it is possible to provide an advantage that the correction operation can cope with the aging of the frequency control circuit.

The present invention is suitable for an oscillation frequency control circuit capable of correcting its own frequency and maintaining a stable oscillation frequency even when a highly stable reference signal is not input thereto and it operates is in a free-running state.

What is claimed is:

1. An oscillation frequency control circuit comprising:
a voltage-controlled oscillator;
a divider configured to divide an output from the voltage-controlled oscillator;
a phase comparator configured to compare phases of an external reference signal and an output from the divider and output a phase difference signal;
a loop filter configured to smooth out an output from the phase comparator and output the smoothed output;
a detection circuit configured to detect the external reference signal;
a pulse generation circuit configured to generate pulses upon receipt of pulse generation information and output the generated pulses to the loop filter;
a memory configured to store control voltage information and the pulse generation information corresponding to the control voltage information;
a control voltage variable circuit configured to perform adjustment of changing a fixed voltage;
a select switch configured to turn on/off a connection between the phase comparator and the loop filter; and
a control unit configured to turn on the select switch when a level of the external reference signal detected by the detection circuit is within an appropriate range while turning off the select switch when the level is outside the appropriate range, and in the case of selecting a control voltage from the control voltage variable circuit, to output a command for selecting the control voltage to the pulse generation circuit, and in the case of not selecting the control voltage from the control voltage variable circuit, to output the pulse generation information stored in the memory to the pulse generation circuit,
wherein the select switch turns off the connection between the phase comparator and the loop filter and selects the control voltage to output the control voltage to the loop filter upon receipt of a control signal for selecting the control voltage input from the control voltage variable circuit, turns on the connection between the phase comparator and the loop filter upon receipt of a control signal for selecting the external reference signal, and turns off the connection between the phase comparator and the loop filter upon receipt of a control signal for selecting the pulses from the pulse generation circuit, and
wherein the control unit outputs the control signal for selecting the external reference signal to turn on the select switch when the level of the external reference signal detected by the detection circuit is within the appropriate range, and outputs any one of the control signal set in advance for selecting the control voltage from the control voltage variable circuit and the control signal set in advance for selecting the pulses from the pulse generation circuit to the select switch when the level of the external reference signal is outside the appropriate range in the state in which the select switch is turned on.

2. The oscillation frequency control circuit according to claim 1, wherein the control voltage information stored in the memory is a value of a center control voltage of a control voltage capable of controlling the voltage-controlled oscillator.

3. The oscillation frequency control circuit according to claim 1, wherein the memory stores an aging characteristics table, instead of the control voltage information and the pulse generation information corresponding to the control voltage information, the table storing a control voltage appropriate for an aging time and pulse generation information corresponding to the control voltage, and
wherein the control unit measures time by means of a timer provided therein, retrieves the control voltage corresponding to the measured time from the aging characteristics table of the memory when the level of the external reference signal is outside the appropriate range, reads the pulse generation information corresponding to the retrieved control voltage, and then outputs the pulse generation information to the pulse generation circuit.

4. The oscillation frequency control circuit according to claim 1, further comprising a level detection circuit configured to detect a voltage level of an output from the loop filter to thereby output latest voltage information to the control unit, wherein the memory stores the latest voltage information and a voltage and pulse generation information table instead of the control voltage information and the pulse generation information corresponding to the control voltage information, the table storing a plurality of pieces of voltage information and pulse generation information corresponding to the plurality of pieces of voltage information, and wherein the control unit updates the latest voltage information of the memory into the latest voltage information input from the level detection circuit, reads the pulse generation information corresponding to the latest voltage information from the voltage and pulse generation information table of the memory when the level of the external reference signal is outside the appropriate range, and then outputs the pulse generation information to the pulse generation circuit.

5. The oscillation frequency control circuit according to claim 1, wherein a voltage controlled crystal oscillator, a temperature-compensated crystal oscillator, or a voltage controlled oven controlled crystal oscillator is used instead of the voltage-controlled oscillator.

6. The oscillation frequency control circuit according to claim 2, wherein a voltage controlled crystal oscillator, a temperature-compensated crystal oscillator, or a voltage controlled oven controlled crystal oscillator is used instead of the voltage-controlled oscillator.

7. The oscillation frequency control circuit according to claim 3, wherein a voltage controlled crystal oscillator, a temperature-compensated crystal oscillator, or a voltage controlled oven controlled crystal oscillator is used instead of the voltage-controlled oscillator.

8. The oscillation frequency control circuit according to claim 4, wherein a voltage controlled crystal oscillator, a temperature-compensated crystal oscillator, or a voltage controlled oven controlled crystal oscillator is used instead of the voltage-controlled oscillator.

9. The oscillation frequency control circuit according to claim 1, wherein the pulse generation circuit is a pulse width modulation circuit, and the pulse generation information output from the control unit is information on a pulse width modulation duty cycle.

10. The oscillation frequency control circuit according to claim 2, wherein the pulse generation circuit is a pulse width modulation circuit, and the pulse generation information output from the control unit is information on a pulse width modulation duty cycle.

11. The oscillation frequency control circuit according to claim 3, wherein the pulse generation circuit is a pulse width modulation circuit, and the pulse generation information output from the control unit is information on a pulse width modulation duty cycle.

12. The oscillation frequency control circuit according to claim 4, wherein the pulse generation circuit is a pulse width modulation circuit, and the pulse generation information output from the control unit is information on a pulse width modulation duty cycle.

13. The oscillation frequency control circuit according to claim 5, wherein the pulse generation circuit is a pulse width modulation circuit, and the pulse generation information output from the control unit is information on a pulse width modulation duty cycle.

14. The oscillation frequency control circuit according to claim 6, wherein the pulse generation circuit is a pulse width modulation circuit, and the pulse generation information output from the control unit is information on a pulse width modulation duty cycle.

15. The oscillation frequency control circuit according to claim 7, wherein the pulse generation circuit is a pulse width modulation circuit, and the pulse generation information output from the control unit is information on a pulse width modulation duty cycle.

16. The oscillation frequency control circuit according to claim 8, wherein the pulse generation circuit is a pulse width modulation circuit, and the pulse generation information output from the control unit is information on a pulse width modulation duty cycle.

* * * * *